(12) United States Patent
Pinarbasi et al.

(10) Patent No.: US 9,337,412 B2
(45) Date of Patent: May 10, 2016

(54) MAGNETIC TUNNEL JUNCTION STRUCTURE FOR MRAM DEVICE

(71) Applicant: Spin Transfer Technologies, Inc., Fremont, CA (US)

(72) Inventors: Mustafa Pinarbasi, Morgan Hill, CA (US); Bartek Kardasz, Pleasanton, CA (US)

(73) Assignee: SPIN TRANSFER TECHNOLOGIES, INC., Fremont, CA (US)

( * ) Notice: Subject to any disclaimer, the term of this patent is extended or adjusted under 35 U.S.C. 154(b) by 0 days.

(21) Appl. No.: 14/492,943

(22) Filed: Sep. 22, 2014

(65) Prior Publication Data

US 2016/0087193 A1 Mar. 24, 2016

(51) Int. Cl.
| | |
|---|---|
| H01L 23/52 | (2006.01) |
| H01L 21/02 | (2006.01) |
| H01L 29/82 | (2006.01) |
| H01L 43/02 | (2006.01) |
| H01L 43/10 | (2006.01) |
| H01L 27/22 | (2006.01) |
| B82Y 25/00 | (2011.01) |

(52) U.S. Cl.
CPC .............. *H01L 43/02* (2013.01); *H01L 27/222* (2013.01); *H01L 43/10* (2013.01); *B82Y 25/00* (2013.01); *Y10S 977/935* (2013.01)

(58) Field of Classification Search
CPC ....... H01L 43/02; H01L 43/10; H01L 27/222; B82Y 25/00; Y10S 977/935
USPC .................. 257/211, 421, E27.081, 295, 425, 257/E27.005, E29.323; 365/158, 171; 438/3, 124, 268, 587
See application file for complete search history.

(56) References Cited

U.S. PATENT DOCUMENTS

| | | | |
|---|---|---|---|
| 341,801 | A | 5/1886 | Fox |
| 5,541,868 | A | 7/1996 | Prinz |
| 5,629,549 | A | 5/1997 | Johnson |
| 5,640,343 | A | 6/1997 | Gallagher et al. |
| 5,654,566 | A | 8/1997 | Johnson |
| 5,691,936 | A | 11/1997 | Sakakima et al. |
| 5,695,846 | A | 12/1997 | Lange et al. |
| 5,695,864 | A | 12/1997 | Slonczewski |

(Continued)

FOREIGN PATENT DOCUMENTS

| | | |
|---|---|---|
| CA | 2766141 A1 | 1/2011 |
| EP | 1345277 A1 | 9/2003 |
| FR | 2817998 A1 | 6/2002 |
| FR | 2832542 A1 | 5/2003 |

(Continued)

OTHER PUBLICATIONS

US 7,026,672, 4/2006, Grandis, Inc. (withdrawn).

(Continued)

Primary Examiner — Ha Tran T Nguyen
Assistant Examiner — Dzung Tran
(74) Attorney, Agent, or Firm — Kaye Scholer LLP

(57) ABSTRACT

A magnetic tunnel junction stack is provided that includes nonmagnetic spacer layers between the free layer and the polarizer layer formed from magnesium oxide and tantalum nitride materials that balance the spin torques acting on the free layer. The design provided enables a deterministic final state for the storage layer and significantly improves the tunneling magnetoresistance value and switching characteristics of the magnetic tunnel junction for MRAM applications.

12 Claims, 8 Drawing Sheets

(56) References Cited

U.S. PATENT DOCUMENTS

| | | | |
|---|---|---|---|
| 5,732,016 A | 3/1998 | Chen et al. | |
| 5,856,897 A | 1/1999 | Mauri | |
| 5,896,252 A | 4/1999 | Kanai | |
| 5,966,323 A | 10/1999 | Chen et al. | |
| 6,016,269 A | 1/2000 | Peterson et al. | |
| 6,055,179 A | 4/2000 | Koganei et al. | |
| 6,097,579 A | 8/2000 | Gill | |
| 6,124,711 A | 9/2000 | Tanaka et al. | |
| 6,134,138 A | 10/2000 | Lu et al. | |
| 6,140,838 A | 10/2000 | Johnson | |
| 6,154,349 A | 11/2000 | Kanai et al. | |
| 6,172,902 B1 | 1/2001 | Wegrowe et al. | |
| 6,233,172 B1 | 5/2001 | Chen et al. | |
| 6,243,288 B1 | 6/2001 | Ishikawa et al. | |
| 6,252,798 B1 | 6/2001 | Satoh et al. | |
| 6,256,223 B1 | 7/2001 | Sun | |
| 6,272,036 B1 | 8/2001 | You et al. | |
| 6,292,389 B1 | 9/2001 | Chen et al. | |
| 6,347,049 B1 | 2/2002 | Childress et al. | |
| 6,376,260 B1 | 4/2002 | Chen et al. | |
| 6,385,082 B1 | 5/2002 | Abraham et al. | |
| 6,436,526 B1 | 8/2002 | Odagawa et al. | |
| 6,458,603 B1 | 10/2002 | Kersch et al. | |
| 6,493,197 B2 | 12/2002 | Ito et al. | |
| 6,522,137 B1 | 2/2003 | Sun et al. | |
| 6,532,164 B2 | 3/2003 | Redon et al. | |
| 6,538,918 B2 | 3/2003 | Swanson et al. | |
| 6,545,906 B1 | 4/2003 | Savtchenko et al. | |
| 6,563,681 B1 | 5/2003 | Sasaki et al. | |
| 6,566,246 B1 | 5/2003 | deFelipe et al. | |
| 6,603,677 B2 | 8/2003 | Redon et al. | |
| 6,653,154 B2 | 11/2003 | Doan et al. | |
| 6,654,278 B1 | 11/2003 | Engel et al. | |
| 6,677,165 B1 | 1/2004 | Lu et al. | |
| 6,710,984 B1 | 3/2004 | Yuasa et al. | |
| 6,713,195 B2 | 3/2004 | Wang et al. | |
| 6,714,444 B2 | 3/2004 | Huai et al. | |
| 6,744,086 B2 | 6/2004 | Daughton et al. | |
| 6,750,491 B2 | 6/2004 | Sharma et al. | |
| 6,765,824 B2 | 7/2004 | Kishi et al. | |
| 6,773,515 B2 | 8/2004 | Li et al. | |
| 6,777,730 B2 | 8/2004 | Daughton et al. | |
| 6,785,159 B2 | 8/2004 | Tuttle | |
| 6,812,437 B2 | 11/2004 | Levy et al. | |
| 6,829,161 B2 | 12/2004 | Huai et al. | |
| 6,835,423 B2 | 12/2004 | Chen et al. | |
| 6,838,740 B2 | 1/2005 | Huai et al. | |
| 6,842,317 B2 | 1/2005 | Sugita et al. | |
| 6,847,547 B2 | 1/2005 | Albert et al. | |
| 6,887,719 B2 | 5/2005 | Lu et al. | |
| 6,888,742 B1 | 5/2005 | Nguyen et al. | |
| 6,902,807 B1 | 6/2005 | Argoitia et al. | |
| 6,906,369 B2 | 6/2005 | Ross et al. | |
| 6,920,063 B2 | 7/2005 | Huai et al. | |
| 6,933,155 B2 | 8/2005 | Albert et al. | |
| 6,958,927 B1 | 10/2005 | Nguyen et al. | |
| 6,967,863 B2 | 11/2005 | Huai | |
| 6,980,469 B2 | 12/2005 | Kent et al. | |
| 6,985,385 B2 | 1/2006 | Nguyen et al. | |
| 6,992,359 B2 | 1/2006 | Nguyen et al. | |
| 6,995,962 B2 | 2/2006 | Saito et al. | |
| 7,002,839 B2 | 2/2006 | Kawabata et al. | |
| 7,005,958 B2 | 2/2006 | Wan | |
| 7,006,375 B2 | 2/2006 | Covington | |
| 7,009,877 B1 | 3/2006 | Huai et al. | |
| 7,041,598 B2 | 5/2006 | Sharma | |
| 7,045,368 B2 | 5/2006 | Hong et al. | |
| 7,170,778 B2 | 1/2007 | Kent et al. | |
| 7,190,611 B2 | 3/2007 | Nguyen et al. | |
| 7,203,129 B2 | 4/2007 | Lin et al. | |
| 7,227,773 B1 | 6/2007 | Nguyen et al. | |
| 7,262,941 B2 | 8/2007 | Li et al. | |
| 7,307,876 B2 | 12/2007 | Kent et al. | |
| 7,335,960 B2 | 2/2008 | Han et al. | |
| 7,351,594 B2 | 4/2008 | Bae et al. | |
| 7,352,021 B2 | 4/2008 | Bae et al. | |
| 7,449,345 B2 | 11/2008 | Horng et al. | |
| 7,476,919 B2 | 1/2009 | Hong et al. | |
| 7,573,737 B2 | 8/2009 | Kent et al. | |
| 7,619,431 B2 | 11/2009 | DeWilde et al. | |
| 7,911,832 B2 | 3/2011 | Kent et al. | |
| 7,936,595 B2 | 5/2011 | Han et al. | |
| 7,986,544 B2 | 7/2011 | Kent et al. | |
| 8,279,666 B2 | 10/2012 | Dieny et al. | |
| 8,334,213 B2 | 12/2012 | Mao | |
| 8,363,465 B2 | 1/2013 | Kent et al. | |
| 8,492,881 B2 | 7/2013 | Kuroiwa et al. | |
| 8,535,952 B2 | 9/2013 | Ranjan et al. | |
| 8,574,928 B2 | 11/2013 | Satoh et al. | |
| 8,617,408 B2 | 12/2013 | Balamane | |
| 8,716,817 B2 | 5/2014 | Saisa et al. | |
| 2002/0090533 A1 | 7/2002 | Zhang et al. | |
| 2002/0105823 A1 | 8/2002 | Redon et al. | |
| 2003/0117840 A1 | 6/2003 | Sharma et al. | |
| 2003/0151944 A1 | 8/2003 | Saito | |
| 2003/0197984 A1 | 10/2003 | Inomata et al. | |
| 2003/0218903 A1 | 11/2003 | Luo | |
| 2004/0012994 A1 | 1/2004 | Slaughter et al. | |
| 2004/0061154 A1* | 4/2004 | Huai et al. | 257/295 |
| 2004/0094785 A1 | 5/2004 | Zhu et al. | |
| 2004/0130936 A1 | 7/2004 | Nguyen et al. | |
| 2004/0257717 A1 | 12/2004 | Sharma et al. | |
| 2005/0041342 A1 | 2/2005 | Huai et al. | |
| 2005/0051820 A1 | 3/2005 | Stojakovic et al. | |
| 2005/0063222 A1 | 3/2005 | Huai et al. | |
| 2005/0104101 A1 | 5/2005 | Sun et al. | |
| 2005/0128842 A1 | 6/2005 | Wei | |
| 2005/0136600 A1 | 6/2005 | Huai | |
| 2005/0158881 A1 | 7/2005 | Sharma | |
| 2005/0180202 A1 | 8/2005 | Huai et al. | |
| 2005/0184839 A1 | 8/2005 | Nguyen et al. | |
| 2005/0201023 A1 | 9/2005 | Huai et al. | |
| 2005/0237787 A1 | 10/2005 | Huai et al. | |
| 2005/0280058 A1 | 12/2005 | Pakala et al. | |
| 2006/0018057 A1 | 1/2006 | Huai | |
| 2006/0049472 A1 | 3/2006 | Diao et al. | |
| 2006/0087880 A1* | 4/2006 | Mancoff et al. | 365/158 |
| 2006/0092696 A1 | 5/2006 | Bessho | |
| 2006/0132990 A1 | 6/2006 | Morise et al. | |
| 2006/0227465 A1 | 10/2006 | Inokuchi et al. | |
| 2007/0019337 A1 | 1/2007 | Apalkov et al. | |
| 2007/0242501 A1 | 10/2007 | Hung et al. | |
| 2008/0049488 A1* | 2/2008 | Rizzo | 365/158 |
| 2008/0112094 A1 | 5/2008 | Kent et al. | |
| 2008/0259508 A2 | 10/2008 | Kent et al. | |
| 2008/0297292 A1 | 12/2008 | Viala et al. | |
| 2009/0072185 A1 | 3/2009 | Raksha et al. | |
| 2009/0091037 A1 | 4/2009 | Assefa et al. | |
| 2009/0098413 A1 | 4/2009 | Kanegae | |
| 2010/0124091 A1 | 5/2010 | Cowburn | |
| 2010/0271870 A1* | 10/2010 | Zheng et al. | 365/171 |
| 2011/0032645 A1 | 2/2011 | Noel et al. | |
| 2011/0089511 A1 | 4/2011 | Keshtbod et al. | |
| 2011/0133298 A1* | 6/2011 | Chen et al. | 257/421 |
| 2012/0052258 A1 | 3/2012 | Op DeBeeck et al. | |
| 2012/0069649 A1 | 3/2012 | Ranjan et al. | |
| 2012/0188818 A1 | 7/2012 | Ranjan et al. | |
| 2012/0280339 A1* | 11/2012 | Zhang et al. | 257/421 |
| 2012/0294078 A1 | 11/2012 | Kent et al. | |
| 2012/0299133 A1 | 11/2012 | Son et al. | |
| 2013/0001506 A1 | 1/2013 | Sato et al. | |
| 2013/0001652 A1 | 1/2013 | Yoshikawa et al. | |
| 2013/0021841 A1 | 1/2013 | Zhou et al. | |
| 2013/0244344 A1 | 9/2013 | Malmhall et al. | |
| 2013/0270661 A1* | 10/2013 | Yi et al. | 257/421 |
| 2013/0341801 A1 | 12/2013 | Satoh et al. | |
| 2014/0042571 A1 | 2/2014 | Gan et al. | |

(56) References Cited

U.S. PATENT DOCUMENTS

2014/0070341 A1 3/2014 Beach et al.
2014/0103472 A1 4/2014 Kent et al.

FOREIGN PATENT DOCUMENTS

| FR | 2910716 A1 | 6/2008 |
|---|---|---|
| JP | H10-4012 A | 1/1998 |
| JP | H11-120758 A | 4/1999 |
| JP | H11-352867 A | 12/1999 |
| JP | 2001-195878 A | 7/2001 |
| JP | 2002-261352 A | 9/2002 |
| JP | 2002-357489 A | 12/2002 |
| JP | 2003-318461 A | 11/2003 |
| JP | 2005-150482 A | 6/2005 |
| JP | 2005-535111 A | 11/2005 |
| JP | 2006-128579 A | 5/2006 |
| JP | 2008-524830 A | 7/2008 |
| JP | 2009-027177 A | 2/2009 |
| JP | 2005-0044848 | 2/2015 |
| WO | WO-2009-080636 A1 | 7/2009 |
| WO | WO-2011-005484 A2 | 1/2011 |
| WO | 2015153142 A1 | 10/2015 |

OTHER PUBLICATIONS

R.H. Koch, et al. Physical Review Letters, vol. 84, No. 23, Jun. 2000 *Thermally Assisted Magnetization Reversal in Submicron-Sized Magnetic Thin Films*, pp. 5419-5422.

Lee et al., Analytical investigation of spin-transfer dynamics using a perpendicular-to-plane polarizer, Applied Physics Letters 86, pp. 022505-1 to 022505-3 (2005).

Martens et al., "Magnetic Reversal in Nanoscopic Ferromagnetic Rings", NSF grants PHY-0351964 (DLS), 2006, (23 pages).

Martens et al., "Thermally Induced Magnetic Switching in Thin Ferromagnetic Annuli", NSF grants PHY-0351964 (DLS), 2005, (11 pages).

Data Storage Institute, R&D Hightlights Sep. 2010, "Magnetic Technology 'spintronics, media and interface'".

Andrew Kent, et al., U.S. Appl. No. 61/715,111, filed Oct. 17, 2012, entitled "Inverted Orthogonal Spin Transfer Layer Stack".

Mustafa Pinarbasi, et al.; U.S. Appl. No. 14/242,419, filed Apr. 1, 2014, entitled "Magnetic Tunnel Junction for MRAM Device".

Mustafa Pinarbasi, et al.; U.S. Appl. No. 14/341,185, filed Jul. 25, 2014, entitled "Method for Manufacturing MTJ Memory Device".

Mustafa Pinarbasi, et al.; U.S. Appl. No. 14/814,036, filed Jul. 30, 2015, entitled "Precessional Spin Current Structure for MRAM".

* cited by examiner

MAGNETIC TUNNEL JUNCTION STRUCTURE FOR MRAM DEVICE

FIELD

The present patent document relates generally to spin-transfer torque magnetic random access memory and, more particularly, to a magnetic tunnel junction layer stack with an orthogonally magnetized layer that provides a final magnetic state of the storage layer deterministically defined by the current polarity.

BACKGROUND

Magnetoresistive random-access memory ("MRAM") is a non-volatile memory technology that stores data through magnetic storage elements. These elements are two ferromagnetic plates or electrodes that can hold a magnetic field and are separated by a non-magnetic material, such as a nonmagnetic metal or insulator. In general, one of the plates has its magnetization pinned (i.e., a "reference layer"), meaning that this layer has a higher coercivity than the other layer and requires a larger magnetic field or spin-polarized current to change the orientation of its magnetization. The second plate is typically referred to as the free layer and its magnetization direction can be changed by a smaller magnetic field or spin-polarized current relative to the reference layer.

MRAM devices store information by changing the orientation of the magnetic moment of the free layer. In particular, based on whether the free layer is in a parallel or anti-parallel alignment relative to the reference layer, either a "1" or a "0" can be stored in each MRAM cell. Due to the spin-polarized electron tunneling effect, the electrical resistance of the cell change due to the orientation of the magnetic fields of the two layers. The cell's resistance will be different for the parallel and anti-parallel states and thus the cell's resistance can be used to distinguish between a "1" and a "0". One important feature of MRAM devices is that they are non-volatile memory devices, since they maintain the information even when the power is off. The two plates can be sub-micron in lateral size and the magnetization can still be stable with respect to thermal fluctuations.

A newer technique, spin transfer torque or spin transfer switching, uses spin-aligned ("polarized") electrons to change the magnetization orientation of the free layer in the magnetic tunnel junction. In general, electrons possess a spin, a quantized number of angular momentum intrinsic to the electron. An electrical current is generally unpolarized, i.e., it consists of 50% spin up and 50% spin down electrons. Passing a current through a magnetic layer polarizes electrons with the spin orientation corresponding to the magnetization direction of the magnetic layer (i.e., polarizer), thus produces a spin-polarized current. If a spin-polarized current is passed to the magnetic region of a free layer in the magnetic tunnel junction device, the electrons will transfer a portion of their spin-angular momentum to the magnetization layer to produce a torque on the magnetization of the free layer. Thus, torque can switch the magnetization of the free layer, which, in effect, writes either a "1" or a "0" based on whether the free layer is in the parallel or anti-parallel states relative to the reference layer.

FIG. 1 illustrates a magnetic tunnel junction ("MTJ") stack 100 for a conventional MRAM device. As shown, stack 100 includes one or more seed layers 110 provided at the bottom of stack 100 to initiate a desired crystalline growth in the above-deposited layers. A pinning layer 112 is disposed on top of seed layers 110 and a synthetic antiferromagnetic layer ("SAF layer") 120 is disposed on top of the pinning layer 112. Furthermore, MTJ 130 is deposited on top of SAF layer 120. MTJ 130 includes the reference layer 132, a barrier layer (i.e., the insulator) 134, and the free layer 136. It should be understood that reference layer 132 is actually part of SAF layer 120, but forms one of the ferromagnetic plates of MTJ 130 when the barrier layer 134 and free layer 136 are formed on reference layer 132. The first magnetic layer in the synthetic antiferromagnetic structure 120 is exchange coupled to the pinning layer 112, which causes, through antiferromagnetic coupling, the magnetization of the reference layer 132 to be fixed. Furthermore, a nonmagnetic spacer 140 is disposed on top of MTJ 130 and a perpendicular polarizer 150 is disposed on top of the nonmagnetic spacer 140. Perpendicular polarizer 150 is provided to polarize a current of electrons ("spin-aligned electrons") applied to MTJ structure 100. Further, one or more capping layers 160 can be provided on top of perpendicular polarizer 150 to protect the layers below on MTJ stack 100. Finally, a hard mask 170 is deposited over capping layers 160 and is provided to pattern the underlying layers of the MTJ structure 100, using a reactive ion etch (RIE) process.

MRAM products having MTJ structures, such as stack 100 illustrated in FIG. 1, are already being used in large data storage devices. In order to instantaneously initiate the magnetization reversal of the storage layer (i.e., the free layer), such MTJ structures utilize perpendicular polarizers whose magnetization is orthogonal to the storage layer. One critical limitation with such designs is that the final magnetic vector state of the storage layer cannot be controlled.

One proposed solution to control the final magnetic vector state is to have a first current polarity to start the magnetization reversal process and a second current polarity to stop the magnetization precession of the free layer at a defined magnetization state. However, implementation of this technique/design is not yet possible due to technological limitations of pulse control, i.e., in the range of 100 picoseconds. In addition, the non-magnetic conductor layers in the conventional MTJ designs are inadequate to obtain high tunneling magnetoresistance value ("TMR") and to achieve the switching characteristics that are required from such devices. Another proposed solution to control the final magnetic state of the storage layer is to have the spin torque from the reference layer be greater than the spin torque from the polarizer. However, this design is only theoretical in nature and has not been successfully manufactured to date.

In addition, effective MTJ structures require large switching currents that limit their commercial applicability. There are at least two critical parameters that control the required size of the switching current: effective magnetization $M_{eff}$ and the damping constant for the free layer structure. Some existing designs have attempted to lower the required switching current by reducing the thickness of the free layer structure. While such a design facilitates a perpendicular component of the magnetization that effectively lowers the $M_{eff}$, the measurable reduction of $M_{eff}$ only occurs when the free layer is very thin (e.g., 1 nanometer). However, such a thin free layer has severe consequences including: (1) a significant reduction of tunneling magnetoresistance value ("TMR"); (2) a lower thermal stability; and (3) an increased damping constant for the free layer.

FIG. 2 illustrates a table comparing the TMR value versus thickness of a CoFeB free layer for a conventional MTJ structure with a copper (Cu) nonmagnetic spacer 140. As shown, the MTR value for a conventional MTJ structure with a 2.3 nm CoFeB free layer is approximately 80%. As is readily apparent, when the thickness of the free layer decreases to decrease the switching current, the TMR value rapidly decreases, for example, to a TMR value of 9% for a CoFeB free layer thickness of 1.5 nm. As further shown, even a CoFeB free layer having a thickness of 1.8 nm provides a device with a TMR value of approximately 38%.

These TMR values are completely inadequate for MRAM applications. In practice, a TMR value of approximately 120% or greater is required to meet the MRAM requirements and specifications. Prior art OST-MTJ structures simply cannot achieve this high TMR and also have inferior switching characteristics due to: (i) the spacer layers used (such as Cu) between the free layer and the polarizer (i.e., a nonmagnetic spacer 140 of FIG. 1); and (ii) poor free layer magnetic properties.

SUMMARY

Accordingly, the MRAM device disclosed herein overcomes the limitations of the prior art designs by providing an MTJ structure with a significantly improved TMR value and optimized free layer magnetic properties, especially effective magnetization ($M_{eff}$) values. The MTJ structure includes an MTJ layer stack with an orthogonally magnetized layer (polarizer) that provides a final magnetic vector state of the storage layer deterministically defined by the current polarity. The MTJ structure balances the spin torque from the polarizer and the reference layers to achieve the deterministic characteristic of switching.

According to an exemplary embodiment, the MTJ structure disclosed herein includes nonmagnetic spacer layers (between the storage/free layer and the polarizer layer) comprised of magnesium oxide (MgO) and tantalum nitride (TaN) materials that balances the spin torques acting on the free layer. The tantalum nitride layer has alpha phase crystalline structure with low resistance. This design enables a deterministic final state for the storage layer and significantly improves the TMR and switching characteristics of the MTJ for MRAM applications.

More particular, an exemplary embodiment provides a magnetic device including an antiferromagnetic structure including a reference layer; a barrier layer disposed on the reference layer; a free layer disposed on the barrier layer; a nonmagnetic spacer layer disposed on the free layer, the nonmagnetic spacer including a layer of tantalum nitride capping material; and a polarizer disposed on the nonmagnetic spacer.

In another embodiment, the nonmagnetic spacer layer further comprises a layer of magnesium oxide.

In another embodiment, the layer of magnesium oxide comprises a thickness of approximately 0.3 nanometers.

In another embodiment, the layer of tantalum nitride capping material comprises a thickness between 1.0 and 5.0 nanometers.

In another embodiment, the layer of tantalum nitride capping material comprises a thickness of approximately 1.0 nanometers.

In another embodiment, the layer of tantalum nitride capping material comprises a thickness of approximately 5.0 nanometers.

In another embodiment, the magnetic device is an orthogonal spin transfer torque structure.

In another embodiment, the reference layer and the free layer each comprise a CoFeB thin film layer having a thickness of approximately 2.3 nanometers and 1.85 nanometers, respectively.

In another embodiment, the nonmagnetic spacer layer further comprises a copper layer having a thickness of approximately 5.0 nanometers and the thickness of the layer of tantalum nitride capping material is approximately 1.0-5.0 nanometers.

In another embodiment, the nonmagnetic spacer layer further comprises a copper layer having a thickness of approximately 10 nanometers, and wherein the layer of tantalum nitride capping material has a thickness of approximately 1.0 nanometers.

In another embodiment, the exemplary magnetic device forms a bit cell of a memory array.

BRIEF DESCRIPTION OF THE DRAWINGS

The accompanying drawings, which are included as part of the present specification, illustrate the presently preferred embodiments and, together with the general description given above and the detailed description given below, serve to explain and teach the principles of the MTJ devices described herein.

Figure 1:
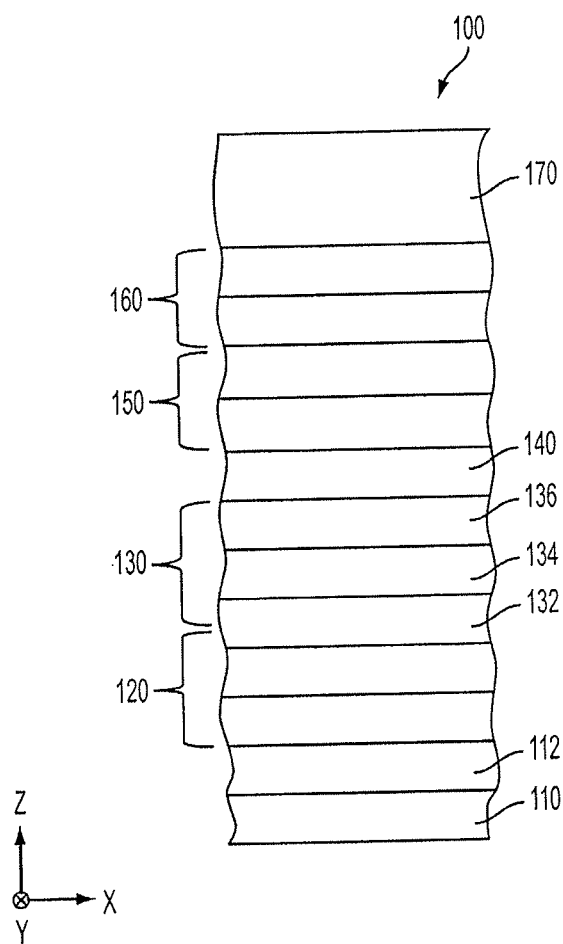
FIG. 1 illustrates a conventional MTJ stack for an MRAM device.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

A magnetic tunnel junction ("MTJ") layer stack is disclosed herein. Each of the features and teachings disclosed herein can be utilized separately or in conjunction with other features and teachings. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the MTJ structure described herein. However, it will be apparent to one skilled in the art that these specific details are only exemplary.

The various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

The MTJ structure disclosed herein includes an MTJ layer stack with an orthogonally magnetized layer (polarizer) that provides a final magnetic vector state of the storage layer deterministically defined by the current polarity. The MTJ structure balances the spin torque from the polarizer and the reference layers to achieve the deterministic characteristic of switching. As will be described in detail below, the MTJ structure includes nonmagnetic spacer layers (between the storage/free layer and the polarizer layer) comprised of MgO and TaN materials that balance the spin torques acting on the free layer. This design enables a deterministic final state for the storage layer and significantly improves the TMR and switching characteristics of the MTJ for MRAM applications.

Figure 3:
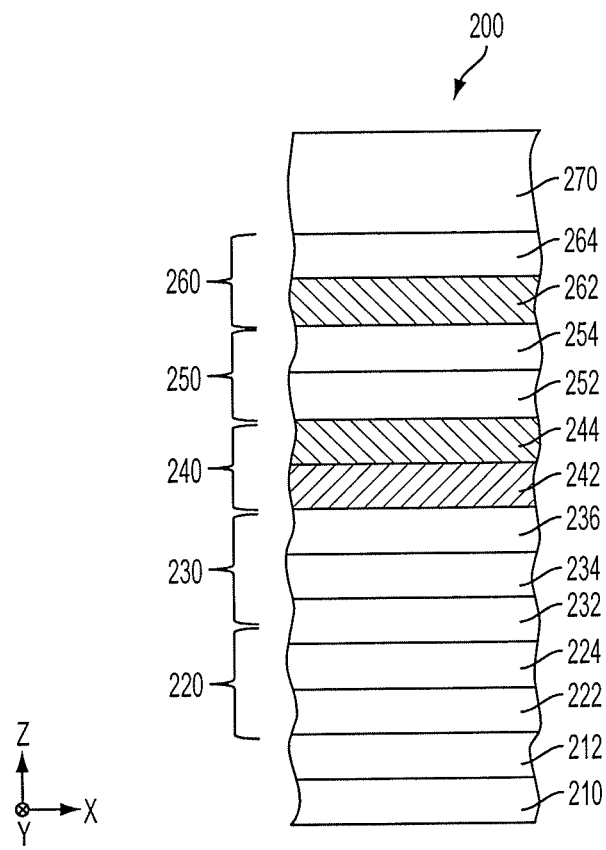
FIG. 3 illustrates an MTJ layer stack in accordance with an exemplary embodiment of the new MTJ layer stack described herein.

In particular, referring to FIG. 3, an MTJ layer stack 200 is shown in accordance with an exemplary embodiment. MTJ stack 200 is an improved design of MTJ stack 100 illustrated in FIG. 1. For illustrative purposes, each of the layers in the MTJ stack 200 are formed in an x,y plane and each have a thickness in the z-axis direction.

MTJ stack 200 includes one or more seed layers 210 provided at the bottom of stack 200 to initiate a desired crystalline growth in the above-deposited layers (discussed below). In the exemplary embodiment, the seed layers 210 can be 3 Ta/40 CuN/5 Ta laminate (as used herein a "slash,"/, indicates a laminated structure starting with the layers at the bottom of the structure beginning from the left of the "slash,"/.), such that the seed layers include a 3 nm layer of tantalum, a 40 nm layer of copper nitride, and a 5 nm layer of tantalum.

Above the seed layers 210 is a pinning layer 212 and a synthetic antiferromagnetic ("SAF") structure 220. According to an exemplary embodiment, pinning layer 212 is platinum manganese PtMn alloy preferably with a thickness of approximately 22 nm. In the exemplary embodiment, the SAF structure 220 is composed of three layers, layer 222, layer 224 and the reference layer 232 (discussed below). Preferably, layer 222 is a cobalt iron alloy preferably with a thickness of approximately 2.1 nm, and layer 224 is a ruthenium metal preferably with a thickness of approximately 0.90 nm.

An MTJ structure 230 is formed on top of the SAF structure 220. The MTJ structure 230 includes three separate layers, namely, reference layer 232 formed in the SAF structure 220, barrier layer 234, and free layer 236. In the exemplary embodiment, reference layer 232 and free layer 236 are cobalt-iron-boron (Co—Fe—B) alloy thin films, with CoFeB reference layer 232 having a thickness of approximately 2.3 nm and CoFeB free layer 236 having a thickness of approximately 1.85 nm. The interlayer electronic exchange coupling between pinned layer 222 and pinning layer 212 pins the magnetization of the pinned layer 222 in a fixed direction as discussed above. The magnetization of the reference layer 232 is fixed through the synthetic anti-ferromagnetic coupling via ruthenium layer 224 to the pinned layer 222. Furthermore, in the exemplary embodiment, barrier layer 234 is formed from an oxide of magnesium MgO. As shown, the MgO barrier layer 234 is disposed between the reference layer 232 and free layer 236 and serves as the tunnel barrier between the two layers. The MgO barrier layer 234 preferably has a thickness of approximately 1.02 nm. Preferably, the thickness of MgO barrier layer 234 is thin enough that a current through it can be established by quantum mechanical tunneling of the spin polarized electrons.

Conventionally, for MTJ structures, a copper (Cu) nonmagnetic spacer is disposed on the free layer as described above with respect to FIG. 1. In the exemplary embodiment, MTJ stack 200 includes a nonmagnetic spacer 240 disposed on the free layer 236 that is composed of a thin MgO layer 242, preferably a 0.3 nm layer, and a thin layer of tantalum nitride TaN capping material 244 on top of the MgO layer 242. In the exemplary embodiment, the thickness of the TaN capping material is between 1.0 and 5.0 nm. It should be appreciated to one skilled in the art that the desired thickness of MgO layer 242 and TaN layer 244 can vary slightly due to manufacturing variations.

Furthermore, according to the exemplary embodiment, an orthogonal spin torque structure that employs a spin-polarizing layer magnetized perpendicularly to free layer 236 to achieve an initial spin-transfer torques is described. As shown, MTJ stack 200 includes a polarizer 250 disposed on the nonmagnetic spacer 240. Polarizer 250 is provided to polarize a current of electrons ("spin-aligned electrons") applied to MTJ stack 200, which in turn can help to change the magnetization orientation of free layer in 236 of the MTJ stack 200 by the torque exerted on free layer 236 from polarized electrons carrying angular momentum perpendicular to the magnetization direction of the free layer 236. Furthermore, the nonmagnetic spacer 240 is provided to magnetically isolate the polarizer 250 from MTJ structure 230.

In the exemplary embodiment, polarizer 250 is comprised of two laminate layer 252, 254. Preferably, the first layer 252 is a laminate layer of 0.3 Co/[0.6 Ni/0.09 Co]×3 and the second layer 254 is a laminate layer composed of 0.21 Co/[0.9 Pd/0.3 Co]×6.

As further shown in FIG. 3, one or more capping layers 260 are provided on top of polarizer 250 to protect the layers below of MTJ stack 200. In the exemplary embodiment, capping layers 260 can be composed of a first laminate layer 262, preferably of 5 nm TaN layer, and a second laminate layer 264, preferably of 7 nm Ru.

A hard mask 270 is deposited over capping layers 260 and may comprise a metal such as tantalum Ta, for example, although alternatively hard mask 270 may comprise other materials. Preferably, the Ta hard mask 270 has a thickness of approximately 70 nm. Hard mask 270 is opened or patterned and is provided to pattern the underlying layers of the MTJ stack 200, using a reactive ion etch (RIE) process, for example.

As noted above, a feature of the MTJ stack 200 of the exemplary embodiment is the deposition of a nonmagnetic spacer 240 disposed on the free layer 236 that is composed of a thin MgO layer 242 and a thin layer of tantalum nitride TaN capping material 244 on top of the MgO layer 242. Conventionally, different materials, such as copper (Cu) have been used for the nonmagnetic spacer disposed on the free layer of the MTJ structure. However, such conventional designs have failed to provide improvement in the performance parameters of the free layer of the MTJ structure while also decreasing the required switching current for optimal operation.

Figure 4:
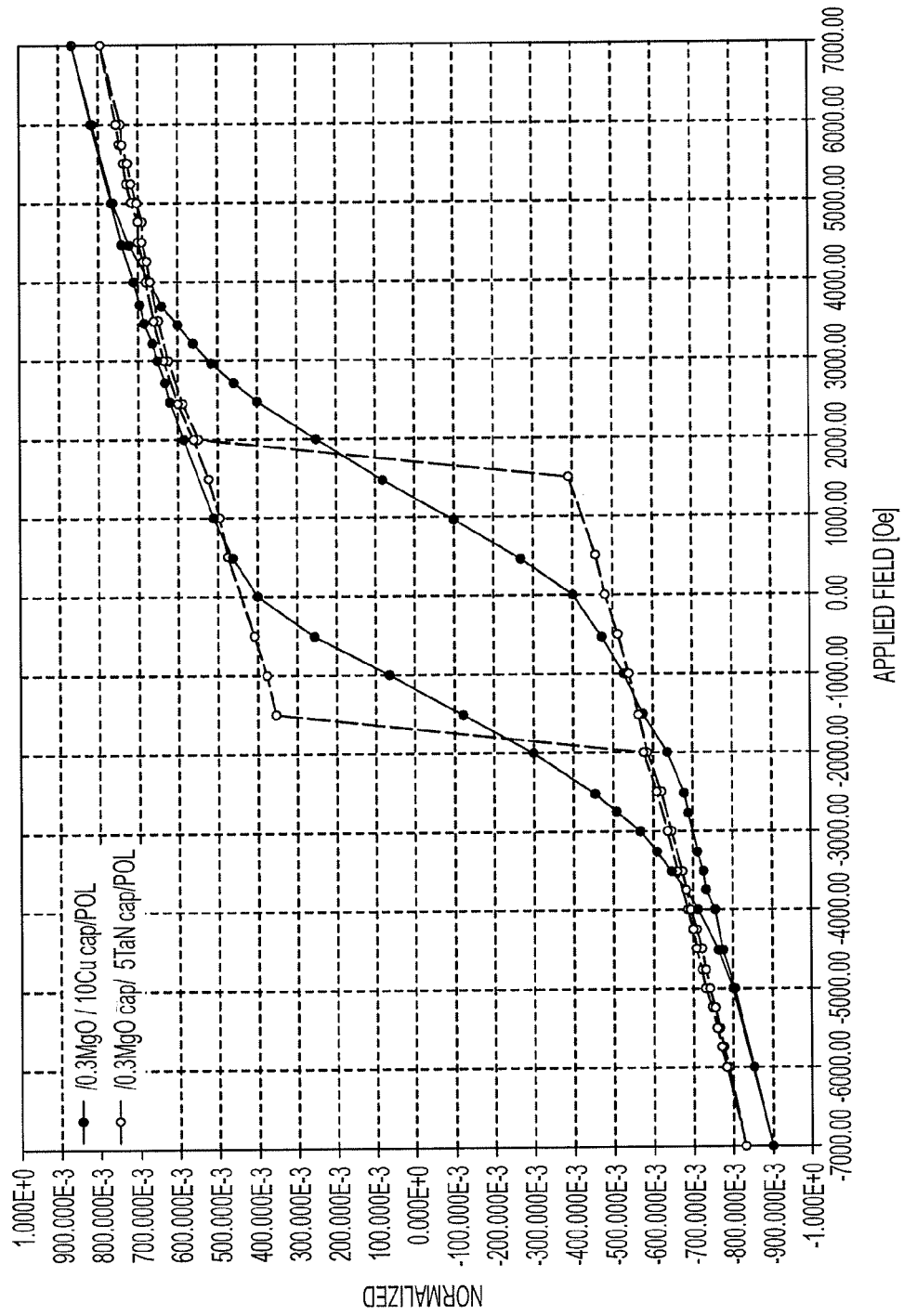
FIG. 4 illustrates a chart that compares magnetic characteristics for a conventional design with the exemplary embodiment of the MTJ structure disclosed herein having the polarizer deposited on an MgO/TaN spacer.

Tests have been conducted comparing the performance parameters of the MTJ structures described herein with conventional design configurations of the prior art. FIG. 4 illustrates a chart that compares magnetic characteristics when the polarizer is deposited on a copper spacer and when the polarizer is deposited on the MgO/TaN spacer according to an exemplary embodiment. As shown, the conventional design with a perpendicular polarizer deposited on a 0.3 nm MgO/10 nm copper spacer has poor polarizer magnetics whereas the design disclosed herein having the polarizer deposited on a 0.3 nm MgO/5.0 TaN spacer has significantly improved polarizer coercivity. In addition, the hysteresis loop indicates that the polarizer deposited on a 0.3 nm MgO/5.0 TaN spacer has higher and well-defined perpendicular magnetic anisotropy (PMA).

Figure 5:
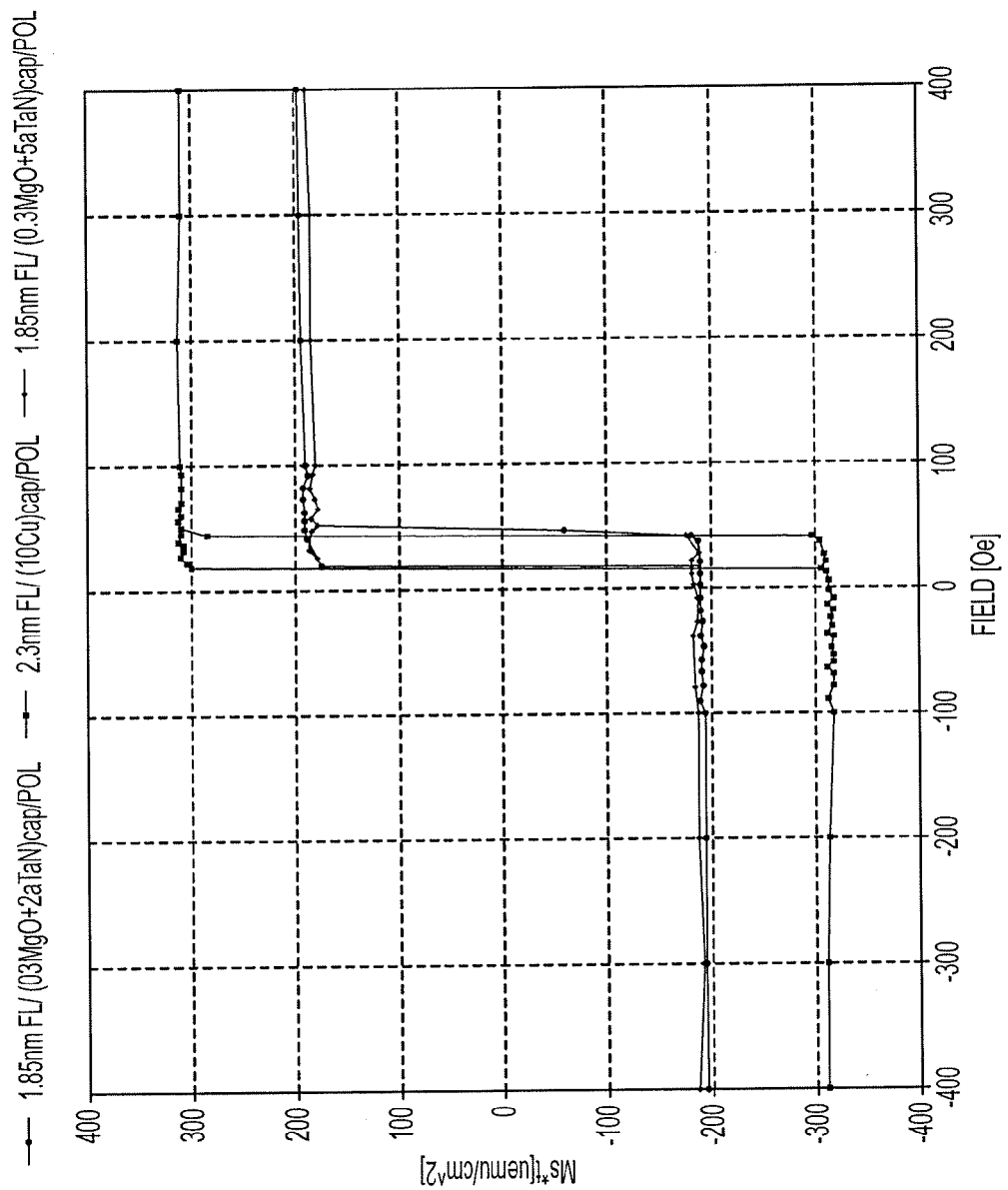
FIGS. 5 and 6 illustrate graphs comparing free layer coercivity of the conventional design with the exemplary embodiment of the MTJ structure disclosed herein having a nonmagnetic spacer composed of MgO and TaN.
Figure 6:
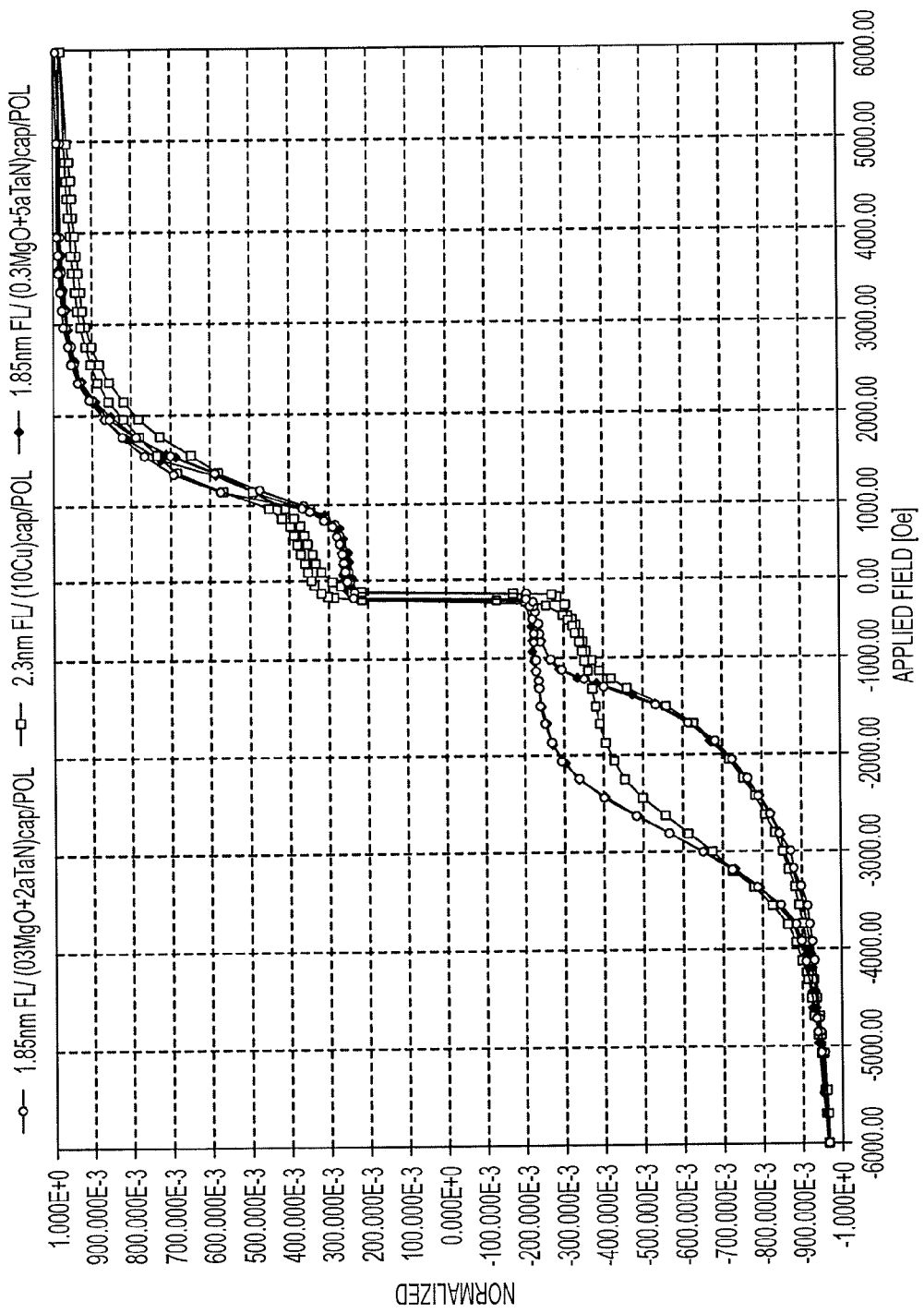

Similarly, FIGS. 5 and 6 illustrate graphs comparing free layer coercivity of the conventional design with the design disclosed herein having a nonmagnetic spacer composed of MgO and TaN. As shown in FIG. 5, the saturation magnetization ($M_s$) is significantly lowered for the design of the exemplary embodiment when compared with conventional designs having a nonmagnetic spacer composed of a 10 nm copper spacer disposed on the free layer. Similarly, FIG. 6 illustrates the design having the MgO/TaN nonmagnetic spacer with improved MTJ characteristics.

Figure 2:
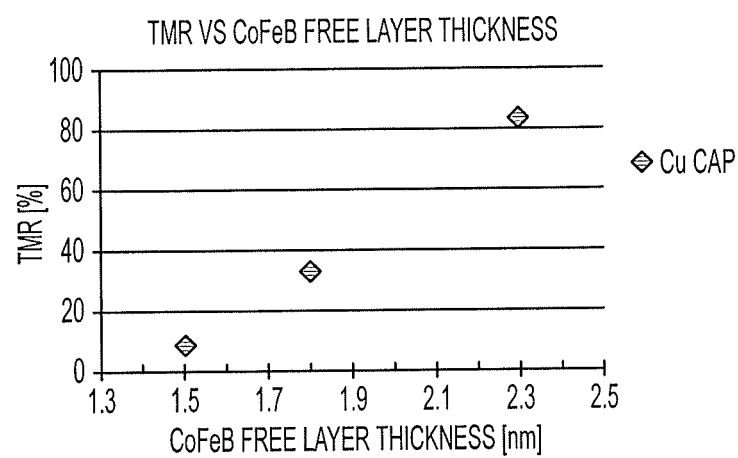
FIG. 2 illustrates a table comparing the TMR value versus thickness of a CoFeB free layer for a conventional MTJ structure with a copper nonmagnetic spacer.
Figure 7:
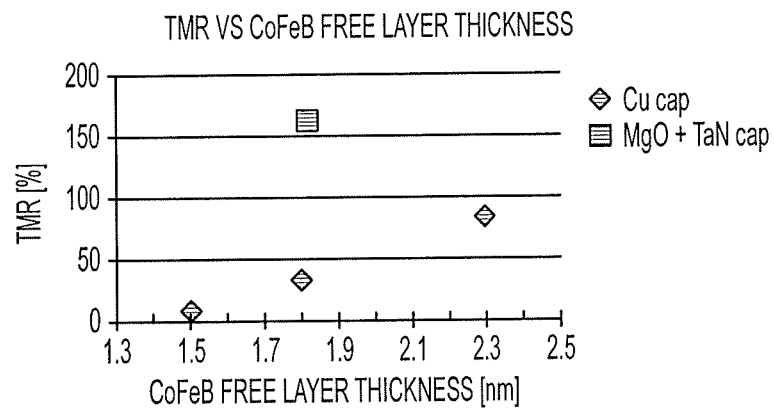
FIG. 7 illustrates a table comparing TMR values for conventional MTJ structures with those of the exemplary embodiment of the MTJ structure disclosed herein.

FIG. 7 illustrates a table comparing the TMR values for conventional MTJ structures with those of the exemplary embodiment disclosed herein. It should be appreciated that this figure compares the illustration of FIG. 2 for a conventional MTJ structure with a copper (Cu) nonmagnetic spacer with a thickness of 1.5 nm, 1.8 nm or 2.3 nm, with the exemplary design having a MgO/TaN nonmagnetic spacer with a thickness of approximately 1.8 nm. As should be appreciated, FIG. 7 illustrates significant improvement in the TMR (approximately 4 times) from a TMR of about 38% for the conventional design to a TMR of about 160% for the exemplary embodiment. In the exemplary embodiment, the thickness of the MgO layer of the nonmagnetic spacer is less than 10 angstroms, and preferably less than 5 angstroms, such that it provides the desired interface with the CoFeB free layer, yet will not increase the full MTJ resistance.

Figure 8:
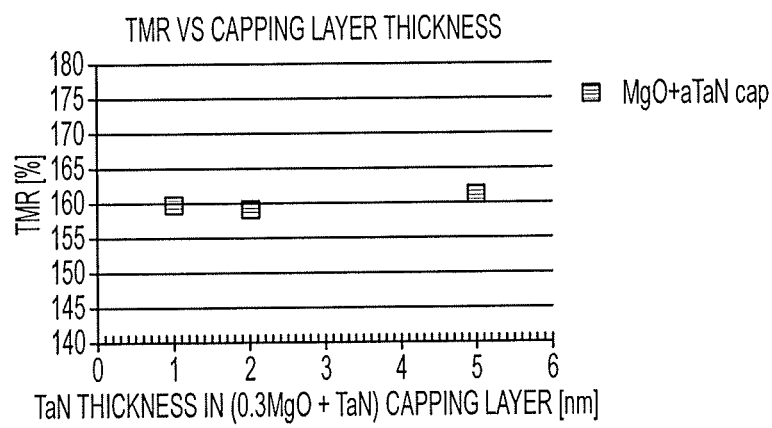
FIG. 8 illustrates a table of the TMR values with a varying TaN thickness according to an exemplary embodiment of the MTJ structure disclosed herein.

FIG. 8 illustrates a table of the TMR values with a varying TaN thickness according to an exemplary embodiment. Since TaN is a spin diffuser layer, a MTJ designer can adjust the spin torque of the exemplary design arising from the polarizer by adjusting the TaN thickness, for example, from 1 nm to 2 nm to 5 nm. Advantageously, FIG. 8 illustrates that the polarizer spin torque can be tuned by adjusting the thickness range of the TaN layer of the nonmagnetic spacer without affecting the value of the TMR.

Table 1 compares performance parameters of the prior art OST-MTJ design and the MTJ design of the exemplary embodiment. In particular, Table 1 illustrates a comparison of the performance parameters between a 10 nm copper nonmagnetic spacer for a conventional MTJ structure and the inventive structure of a MgO/TaN nonmagnetic spacer disposed on the free layer 236 in accordance with the exemplary embodiment described herein. Table 1 illustrates data for the MgO layer 242 having a thickness of 0.3 nm and the TaN layer 244 having a thickness of either 1.0 nm, 2.0 nm or 5.0 nm.

TABLE 1

| Performance Parameter | Units | 10 nm Cu Cap | 0.3 nm MgO + 1.0 nm αTaN FL Cap | 0.3 nm MgO + 2.0 nm αTaN FL Cap | 0.3 nm MgO + 5.0 nm αTaN FL Cap |
|---|---|---|---|---|---|
| $M_{s, Free\ layer}$ *t | [μemu/cm$^2$] | 315 | 200 | 188 | 196 |
| $Hc_{, Free\ layer}$ | [mT] | 1.25 | 1.37 | 1.45 | 1.25 |
| $4\pi M_{eff}$[T] Free layer | [T] | 1.01 | 0.78 | 0.67 | 0.68 |
| $M_{eff}/M_s$ | [ ] | 0.56 | 0.43 | 0.37 | 0.38 |
| $H_{shift, Free\ layer}$ | [mT] | 3.0 | 3.0 | 3.0 | 3.0 |
| Damping Constant (α) | [ ] | 0.017 | 0.009 | 0.008 | 0.008 |
| $H_C$, Polarizer | [T] | 0.26 | 0.09 | 0.12 | 0.17 |
| TMR | % | 84 | 160 | 162 | 163 |
| RA | [Ohm μm$^2$] | 4.3 | 10.2 | 10.3 | 10.5 |

As shown, significant improvements in important characteristics for an MTJ structure are achieved by the exemplary embodiment. For example, the saturation magnetization ($M_s$) is significantly lowered by approximately 40%, the effective magnetization $M_{eff}$ (i.e., in-plane magnetization) is decreased by over 35%, and the damping constant is reduced by over 50%. Moreover, Table 1 illustrates that the properties of the free layer are independent of the thickness of the TaN layer 244. In particular, the TMR is 162%-163% when the TaN layer has a thickness of either 1.0 nm, 2.0 nm or 5.0 nm. As a result and described above, the exemplary embodiment advantageously facilitates tuning of the polarizer spin torque without impacting the free layer properties and the TMR values of the MTJ structure.

Figure 9A:
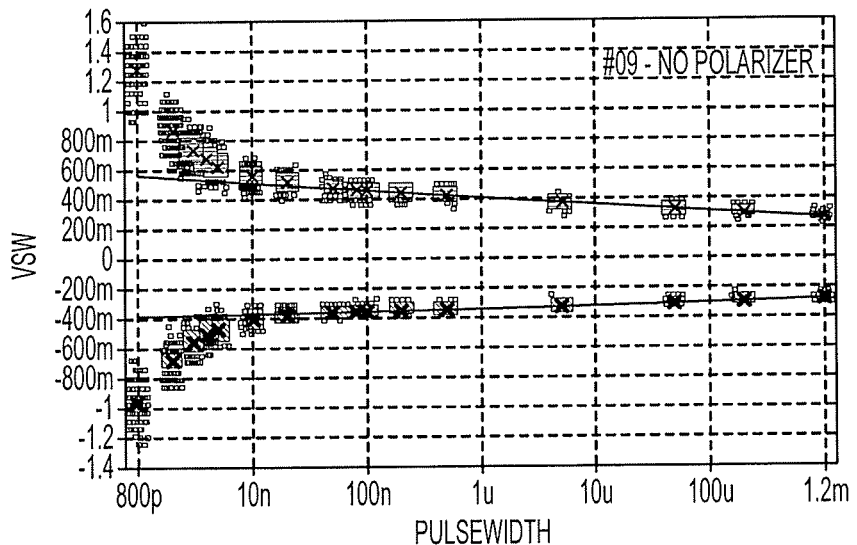
FIG. 9A illustrates the switching behavior for an MTJ device with no polarizer and FIG. 9B illustrates the same data for an MTJ device with a polarizer.
Figure 9B:
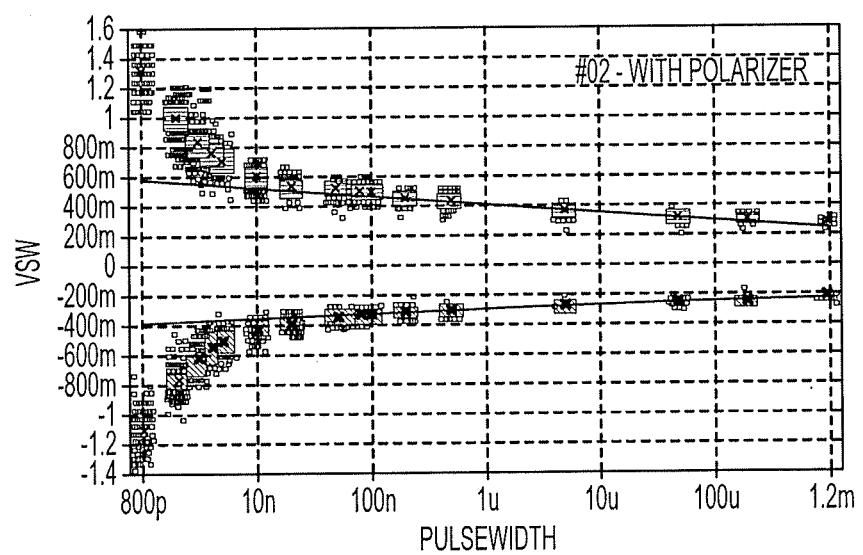

FIG. 9A illustrates the switching behavior for an MTJ device with no polarizer. In contrast, FIG. 9B illustrates the same data for an MTJ device with a polarizer. As shown in FIG. 9B, the switching is deterministic, meaning that the negative and positive polarity sets the final magnetization states as in the collinear case of FIG. 9A.

Table 2 illustrates a comparison of the performance parameters of alternative embodiments of the present disclosure herein. Each of these structures are similar in design to the MTJ structure illustrated in FIG. 3 with variations to the nonmagnetic spacer disposed on the free layer 236. In particular, the four columns of Table 2 illustrates MTJ characteristics with variations of the layers of the nonmagnetic spacer 240, including: (i) a 1 nm TaN/5 nm Cu spacer; (ii) 3 nm TaN/5 nm Cu spacer; (iii) 5 nm TaN/5 nm Cu spacer; and (iv) a 0.3 MgO/2.0 nm TaN/10 nm Cu spacer. These structures also extend the anti-ferromagnet annealing temperature of the MTJ structure to 350 C to 400 C.

TABLE 2

| Performance Parameter | Units | 1.0 nm TaN + 5.0 nm Cu | 3.0 nm TaN + 5.0 nm Cu | 5.0 nm TaN + 5.0 nm Cu | 0.3 nm MgO + 2.0 nm TaN + 10.0 nm Cu |
|---|---|---|---|---|---|
| $M_{s, Free\ layer}$ *t | [μemu/cm$^2$] | 269 | 242 | 250 | 262 |
| Hc, $_{Free\ layer}$ | [mT] | 0.75 | 0.88 | 0.86 | 0.65 |
| $4\pi M_{eff}$[T] Free layer | [T] | 0.76 | 0.77 | 0.78 | 0.85 |
| $M_{eff}/M_s$ | [ ] | 0.42 | 0.43 | 0.43 | 0.47 |
| $H_{shift, Free\ layer}$ | [mT] | 5.0 | 4.2 | 4.2 | 2.8 |
| Damping Constant (α) | | 0.011 | | | 0.008 |
| $H_C$, Polarizer | [T] | 0.33 | 0.34 | 0.35 | 0.30 |
| TMR | % | 124 | 126 | 127 | 138 |
| RA | [Ohm μm$^2$] | 4.5 | 5.0 | 5.0 | 7.8 |

It should be appreciated that when each of these exemplary designs are compared with the conventional MTJ structure having a nonmagnetic spacer of a 10 nm copper layer (see, e.g., Table 1), these alternative designs exhibit improved MTJ characteristics. In particular, each of these designs achieve a lowered saturation magnetization ($M_s$), a decreased effective magnetization $M_{eff}$ (i.e., in-plane magnetization), and a reduced damping constant. Moreover, the TMR value remains significantly higher than the conventional design as discussed above.

As described above, the present disclosure provide an MTJ structure that includes a spacer structure between free layer and polarizer that facilitates the tuning of the polarizer spin torque acting on the free layer. Further, the exemplary MTJ structure maximizes the reference layer spin torque and promotes: (i) a low effective magnetization ($M_{eff}$) of the free layer; (ii) a low damping constant; (iii) a sharp interface with the free layer so as to eliminate a magnetically dead layer; (iv) a high TMR ratio with thinner CoFeB layers; and/or (v) does not significantly increase the resistance of the full MTJ structure. As a result, a lower switching current and a faster magnetization reversal process is achieved by combining a higher TMR, a low damping constant, a low effective magnetization for the free layer with yet a high thermal stability by having a high $M_s$ (or $M_s/M_{eff}$ ratio). Moreover, the MTJ structure provides a storage layer magnetization direction that is defined by the current polarity.

It is further contemplated that all of the layers of MTJ stack 200 illustrated in FIG. 3 can be formed by a thin film sputter deposition system as would be appreciated by one skilled in the art. The thin film sputter deposition system can include the necessary physical vapor deposition (PVD) chambers, each having one or more targets, an oxidation chamber and a sputter cleaning chamber. The sputter deposition process involves a sputter gas (e.g., oxygen, argon, or the like) with an ultra-high vacuum and the targets can be made of the metal or metal alloys to be deposited on the substrate.

Furthermore, it should be appreciated to one skilled in the art that a plurality of MTJ stacks 200 (as shown in FIG. 3) can be manufactured and provided as respective bit cells of an STT-MRAM device. In other words, each MTJ stack 200 can be implemented as a bit cell for a memory array having a plurality of bit cells.

The above description and drawings are only to be considered illustrative of specific embodiments, which achieve the features and advantages described herein. Modifications and substitutions to specific process conditions can be made. Accordingly, the embodiments in this patent document are not considered as being limited by the foregoing description and drawings.

What is claimed is:

1. A magnetic device, comprising
an antiferromagnetic structure including a reference layer;
a barrier layer disposed over the reference layer;
a free layer having a free layer magnetization direction disposed on the barrier layer, the reference layer, the barrier layer and the free layer forming a magnetic tunnel junction;
a nonmagnetic spacer layer disposed on the free layer; and
a polarizer disposed on the magnetic spacer layer, the polarizer layer having a magnetization direction that is perpendicular to the free layer magnetization direction,
wherein the nonmagnetic spacer layer is disposed between the free layer of the magnetic tunnel junction and the polarizer, the nonmagnetic spacer layer comprising a thin layer of magnesium oxide (MgO) on the free layer and a layer of tantalum nitride (TAN) capping material on the thin layer of MgO.

2. The magnetic device according to claim 1, wherein the thin layer of magnesium oxide comprises a thickness of approximately 0.3 nanometers.

3. The magnetic device according to claim 2, wherein the layer of tantalum nitride capping material comprises a thickness between 1.0 and 5.0 nanometers.

4. The magnetic device according to claim 3, wherein the layer of tantalum nitride capping material comprises a thickness of approximately 1.0 nanometers.

5. The magnetic device according to claim 3, wherein the layer of tantalum nitride capping material comprises a thickness of approximately 5.0 nanometers.

6. The magnetic device according to claim 1, wherein the magnetic device is an orthogonal spin torque structure.

7. The magnetic device according to claim 1, wherein the reference layer and the free layer each comprise a CoFeB thin film layer having a thickness of approximately 2.3 nanometers and 1.85 nanometers, respectively.

8. The magnetic device according to claim 1, wherein the nonmagnetic spacer layer further comprises a copper layer having a thickness of approximately 5.0 nanometers.

9. The magnetic device according to claim 8, wherein the thickness of the layer of tantalum nitride capping material is approximately 1.0 nanometers.

10. The magnetic device according to claim 8, wherein the thickness of the layer of tantalum nitride capping material is approximately 3.0 nanometers.

11. The magnetic device according to claim 8, wherein the thickness of the layer of tantalum nitride capping material is approximately 5.0 nanometers.

12. The magnetic device according to claim 2, wherein the nonmagnetic spacer layer further comprises a copper layer having a thickness of approximately 10 nanometers, and wherein the layer of tantalum nitride capping material has a thickness of approximately 1.0 nanometers.

\* \* \* \* \*